(12) United States Patent
Fang et al.

(10) Patent No.: US 7,943,511 B2  
(45) Date of Patent: May 17, 2011

(54) SEMICONDUCTOR PROCESS

(75) Inventors: Chun-Chieh Fang, Tainan County (TW); Po-Jong Chen, Kaohsiung (TW); Tsung-Min Kuo, Tainan (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 12/504,929

(22) Filed: Jul. 17, 2009

(65) Prior Publication Data

US 2011/0014784 A1    Jan. 20, 2011

(51) Int. Cl.
*H01L 21/44*      (2006.01)

(52) U.S. Cl. .................. 438/660; 438/612; 438/622

(58) Field of Classification Search .................. 438/612, 438/622, 660  
See application file for complete search history.

(56) References Cited

U.S. PATENT DOCUMENTS

| | | | |
|---|---|---|---|
| 6,077,778 A * | 6/2000 | Hsiao et al. | 438/656 |
| 6,204,203 B1 * | 3/2001 | Narwankar et al. | 438/785 |
| 6,207,546 B1 * | 3/2001 | Chen et al. | 438/612 |
| 6,603,203 B2 * | 8/2003 | Amanuma | 257/758 |
| 6,638,867 B2 * | 10/2003 | Liu et al. | 438/692 |
| 6,707,088 B2 | 3/2004 | Fishburn | |
| 7,084,063 B2 | 8/2006 | Noguchi et al. | |
| 2006/0121717 A1 * | 6/2006 | Yu et al. | 438/612 |
| 2009/0011583 A1 * | 1/2009 | Hong et al. | 438/586 |

\* cited by examiner

*Primary Examiner* — Charles Garber  
*Assistant Examiner* — Bryan R Junge  
(74) *Attorney, Agent, or Firm* — WPAT, PC; Justin King

(57) ABSTRACT

A semiconductor process is provided. First, a substrate having a dielectric layer formed thereon is provided. Thereafter, an interconnection structure including copper is formed in the dielectric layer. Afterwards, a metal layer is formed on the dielectric layer. The metal layer is then patterned to form a pad. An annealing process is performed, wherein the gas source for the annealing process includes hydrogen in a concentration of 50% to 90%.

12 Claims, 2 Drawing Sheets

SEMICONDUCTOR PROCESS

BACKGROUND OF THE INVENTION

1. Field of Invention

The present invention relates to a semiconductor process, and more particularly to a method for reducing a leakage path.

2. Description of Related Art

Plasma is a partially ionized gas, and is widely applied in a semiconductor process such as film deposition, etching or ion implantation. However, plasma can move along the metal during the process and generates the so-called "antenna effect", so that the device of the performance is affected.

For example, a dynamic random access memory (DRAM) cell stores data with a capacitor. The data of the memory cell is determined by the charges of the capacitor. The level of integration of memory cells is getting increased as the technology is getting developed. Meanwhile, the capacitance of the capacitor has to be increased as the dimension of the memory cell is getter smaller, so that the possibility of mis-judging data is reduced, the data refresh frequency is reduced, and the operation efficiency is increased.

The data access of the DRAM cell is by storing or refreshing the charges in the capacitor. If a leakage occurs in the capacitor, the data refresh frequency is increased, the data access speed is affected, and even an error in data access is caused. The above-mentioned problems are generated in the process using plasma for fabricating the DRAM, such as a high density plasma chemical vapor deposition (HDPCVD) process for depositing a silicon oxide dielectric layer having a good filling property, or an etching process for etching aluminum with plasma. That is, during the process using plasma, the charges accumulate on the surface of the dielectric layer, and move along the metal interconnection to the silicon substrate, so that a portion of the charges are captured by the dangling bonds of the silicon substrate to form a leakage path, resulting in serious problems such a short refresh time of the capacitor or a large distribution of the threshold voltage.

Therefore, it has become one of the main topics in the industry to solve the leakage problem resulted from the conventional process using plasma and reduce the data refresh frequency of the DRAM, so that semiconductor devices are fabricated with high yield and high reliability, and the quality and performance of the devices are assured.

SUMMARY OF THE INVENTION

Accordingly, the present invention provides a semiconductor process in which the possibility of generating a leakage path is reduced and the performance of the device is enhanced.

The present invention provides a semiconductor process. First, a substrate having a dielectric layer formed thereon is provided. Thereafter, an interconnection structure including copper is formed in the dielectric layer. Afterwards, a metal layer is formed on the dielectric layer. The metal layer is then patterned to form a pad. An annealing process is performed, wherein the gas source for the annealing process includes hydrogen in a concentration of 50% to 90%.

According to an embodiment of the present invention, the step of performing the annealing process is after the step of forming the metal layer and before the step of patterning the metal layer.

According to an embodiment of the present invention, the step of performing the annealing process is after the step of forming the pad.

According to an embodiment of the present invention, the temperature of the annealing process is between about 410° C. and 475° C.

According to an embodiment of the present invention, the time of the annealing process is between about 20 minutes and 60 minutes. The time of performing the annealing process can be 20, 30 or 60 minutes.

According to an embodiment of the present invention, the gas source for the annealing process includes hydrogen in a concentration of about 70%.

According to an embodiment of the present invention, the step of patterning the metal layer includes using plasma.

According to an embodiment of the present invention, the material of the dielectric layer is selected from the group consisting of SiN, SiCN, a low-k material with a dielectric constant less than 4 and fluorinated silicate glass (FSG).

According to an embodiment of the present invention, the method of forming the interconnection structure includes performing a damascene process.

In the present invention, an annealing process is performed with high concentration of hydrogen before or after the step of etching the metal layer. Hydrogen can repair (or stabilize) the dangling bonds in a high temperature environment, so that the charges accumulated on the substrate are reduced and the possibility of leaking is reduced as well.

In order to make the aforementioned and other objects, features and advantages of the present invention comprehensible, a preferred embodiment accompanied with figures is described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

The semiconductor process of the present invention is applicable to the copper backend process. After a metal interconnection including copper is formed, an annealing process is performed before or after the step of etching the metal layer to form a pad, so as to remove the accumulated charges and impurities on the silicon substrate and repair the dangling bonds. In details, the gas source for the annealing process of the present invention includes hydrogen in a concentration of about 50% to 90%. In an embodiment, the annealing process uses hydrogen in a concentration of about 70%. Further, the gas source for the annealing process can further include an inert gas such as nitrogen. The temperature of performing the annealing process is between about 410° C. and 475° C. The time of performing the annealing process is between about 20 minutes and 60 minutes. The time of performing the annealing process can be 20, 30 or 60 minutes. The annealing time of 60 minutes is long enough to repair the dangling bonds. The annealing time of more than 60 minutes can not further enhance the repairing performance of the dangling bonds.

It is noted that small-molecular hydrogen has an excellent diffusion property, so that hydrogen can diffuse into the underlying layers and even reach the inner of the silicon substrate in a high temperature environment. Thus, the charges and impurities accumulated on the surface of the silicon substrate during the step of depositing the dielectric layer with plasma or etching the metal layer with plasma can be removed by the hydrogen annealing process. Further, after the metal interconnection is completed in the backend process, the annealing process is performed with high concentration of hydrogen, so that the dangling bonds can be reduced to stabilized bonds by hydrogen, the possibility of generating a leakage path is reduced, and the performance of the device is enhanced.

The application of the present invention will be described in the following. The below process flow is provided for illustration purposes and thereby enables persons skilled in the art to practice the present invention, but is not intended to limit the scope of the present invention. It is appreciated by persons skilled in the art that the configurations, forming methods and forming sequences of the components such as conductive parts, semiconductor devices, metal interconnections, dielectric layers or pads can be formed with known methods and are not limited by the following embodiments.

Figure 1A:
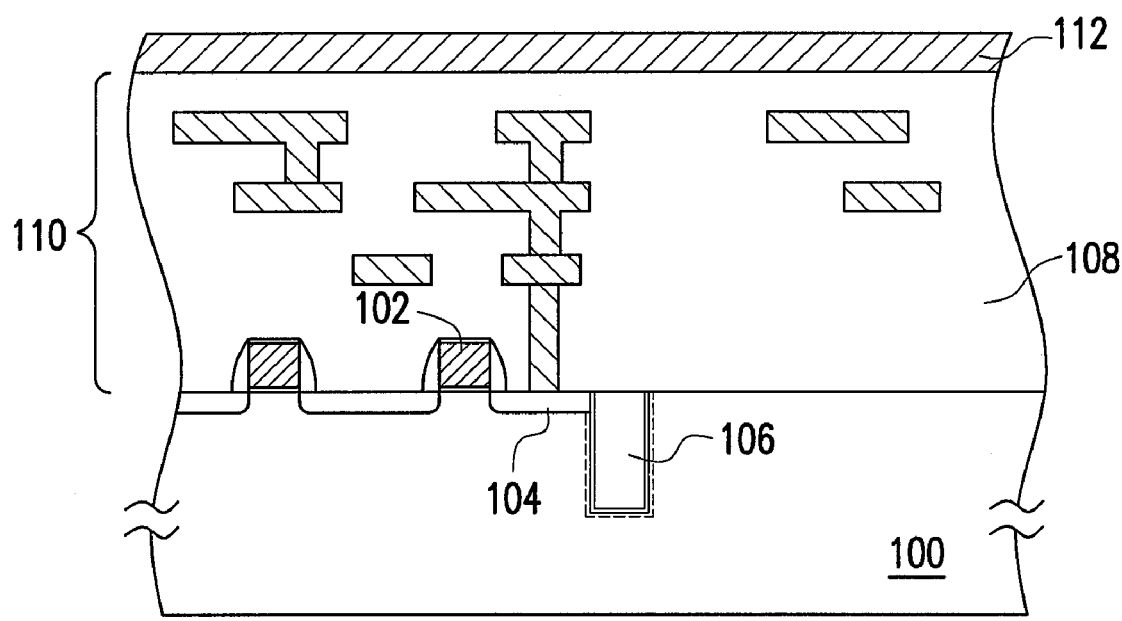
FIGS. 1A to 1B schematically illustrate cross-section views of a semiconductor process according to an embodiment of the present invention.
Figure 1B:
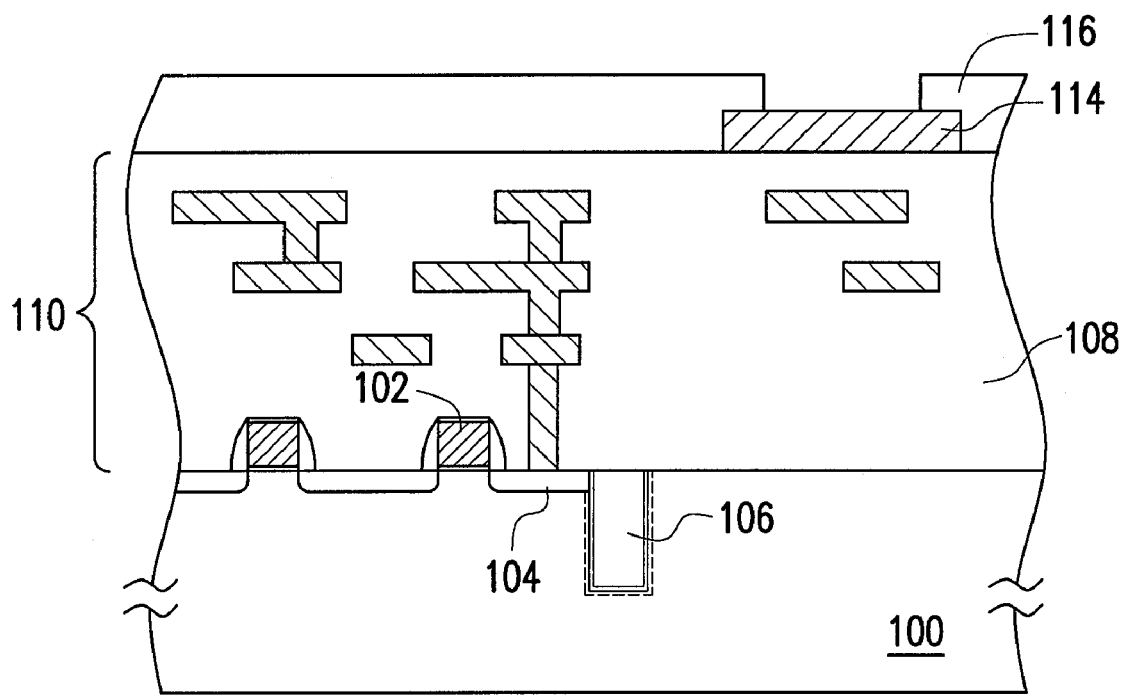

FIGS. 1A to 1B schematically illustrate cross-section views of a semiconductor process according to an embodiment of the present invention.

Referring to FIG. 1A, a substrate 100 is provided. The substrate 100 may be a semiconductor substrate, such as a monocrystalline silicon substrate. A plurality of conductive parts or known semiconductor devices is formed in or on the substrate 100. This embodiment is illustrated by exemplifying that a DRAM memory and a transistor have been formed on the substrate 100. The substrate 100 has a transistor 102 formed thereon, and a doped region 104 and a capacitor 106 formed therein. Thereafter, a dielectric layer 108 is formed on the substrate 100. A metallization process is then performed to form an interconnection structure 110 in the dielectric layer 108. The dielectric layer 108 may include a plurality of dielectric material layers. The material of the dielectric layer 108 is selected from the group consisting of SiN, SiCN, a low-k material with a dielectric constant less than 4 and fluorinated silicate glass (FSG). The low-k material may be a silsesquioxane material such as hydrogen silsesquioxane (HSQ), methyl silsesquioxane (MSQ) or hybrido-organo siloxane polymer (HOSP); an aromatic hydrocarbon compound such as SiLK; an organosilicate glass such as black diamond (BD), 3MS or 4MS; parylene; a fluoro-polymer such as PFCB, CYTOP or Teflon; poly(arylether) such as PAE-2 or FLARE; a porous polymer such as XLK, Nanofoam or Aerogel; or Coral. The method of forming the dielectric layer 108 includes plasma-enhanced chemical vapor deposition (PECVD) or high density plasma chemical vapor deposition (HDPCVD). In an embodiment, the interconnection structure 110 includes copper, and the forming method thereof includes performing a damascene process or a dual damascene process. Afterwards, a metal layer 112 is formed on the dielectric layer 108. The metal layer includes aluminum, for example.

During the step of forming the dielectric layer 108 and the interconnection structure 110, plasma is used to deposit the dielectric material or perform an etching process, so that the charges accumulate on the surface of the substrate 100, and the electronic features of the device are affected. In the present invention, after the step of forming the metal layer 112 and before the step of patterning the metal layer 112, an annealing process is performed to alloy the metal layer 112 and remove the charges accumulated on the surface of the substrate 100. The gas' source for the annealing process of the present invention includes hydrogen in a concentration of about 50% to 90%. In an embodiment, the annealing process uses hydrogen in a concentration of about 70%. Further, the gas source for the annealing process can further include an inert gas such as nitrogen. The temperature of performing the annealing process is between about 410° C. and 475° C. The time of performing the annealing process is between about 20 minutes and 60 minutes. In an embodiment, the time of performing the annealing process is 20 minutes. In another embodiment, the time of performing the annealing process is 30 minutes. In another embodiment, the time of performing the annealing process is 60 minutes. As hydrogen in high concentration is used as the gas source for the annealing process, not only the surface charges can be removed, but also the dangling bonds in the materials can be reduced to stabilized bonds by hydrogen. Thus, the possibility of leaking is reduced, and the quality and device performance of the DRAM are enhanced.

Referring to FIG. 1B, the metal layer 112 is patterned to form a pad 114. The method of patterning the metal layer 112 includes performing a lithography process and an etching process. A portion of the metal layer 112 is removed by the etching process with plasma. Thereafter, a protective layer 116 is formed on the substrate 100, exposing a portion of the pad 114. The protective layer 116 not only prevents the device and circuit from being in contact with the ambiance and affected by humidity or pollutants, but also prevents the metal from being oxidized or damaged. The material of the protective layer 116 is selected from the group consisting of silicon oxide, silicon nitride, silicon oxynitride, borosilicate glass (BSG), phosphosilicate glass (PSG), borophosphosilicate glass (BPSG), other suitable insulation materials and combinations thereof.

It is noted that the annealing process of the present invention can be performed not only before the step of etching the metal layer 112, but also after the step of patterning the metal layer 112 to form the pad 114. The step of patterning the metal layer 112 includes performing an etching process to the metal layer 112 with plasma, so that the charges accumulates after the step of patterning the metal layer 112. The annealing process is performed, using hydrogen in a concentration of 50% to 90% under the above-mentioned conditions, to remove the charges accumulated on the surface of the substrate 100 and to repair the dangling bonds in the materials, so that the possibility of leaking is reduced and the performance of the device is enhanced. In an embodiment, an annealing process is performed with high concentration of hydrogen after the step of patterning the metal layer 112, so that the dangling bonds formed during the step of patterning the metal layer 112 can be repaired with hydrogen to form stabilized bonds. Apparently, the annealing step has better performance after the step of etching the metal layer 112, rather than before the step of etching the metal layer 112.

The above-mentioned embodiments in which the annealing process is performed before or after the step of etching he metal layer 112 is provided for illustration purposes, and is not construed as limiting the present invention. The timing of performing the annealing process can be adjusted upon the process requirement. By performing the annealing process before or after the step of etching the metal layer 112 with high concentration of hydrogen, small-molecular hydrogen can diffuse into the underlying layers due to the excellent diffusion property, so that the electrons and impurities accumulated on the surface of the substrate 100 during the process using plasma can be removed, the dangling bonds can be reduced to stabilized bonds by hydrogen, and the possibility of generating a leakage path is reduced. Further, the dielectric layer 108 includes a low dielectric constant material or FSG, and the interconnection structure 110 includes copper, so that the possibility of using plasma for depositing or etching is reduced, and the possibility of affecting the device performance by using plasma is reduced accordingly. Thereafter, the semiconductor process of the present invention can provide at least the following advantages, such as removing the accumulated charges resulted from plasma, alloying aluminum, adjusting the threshold voltage, stabilizing the junction leakage and repairing the dangling bonds in the monocrystalline silicon substrate, so that the DRAM refresh time is increased, the operation efficiency is increased, and the power consumption is saved.

The following example is provided to prove that the semiconductor process of the present invention can enhance the performance of the device. The example is provided to illustrate the relation between the DRAM refresh time and the semiconductor process of the present invention.

EXAMPLE

Figure 2:
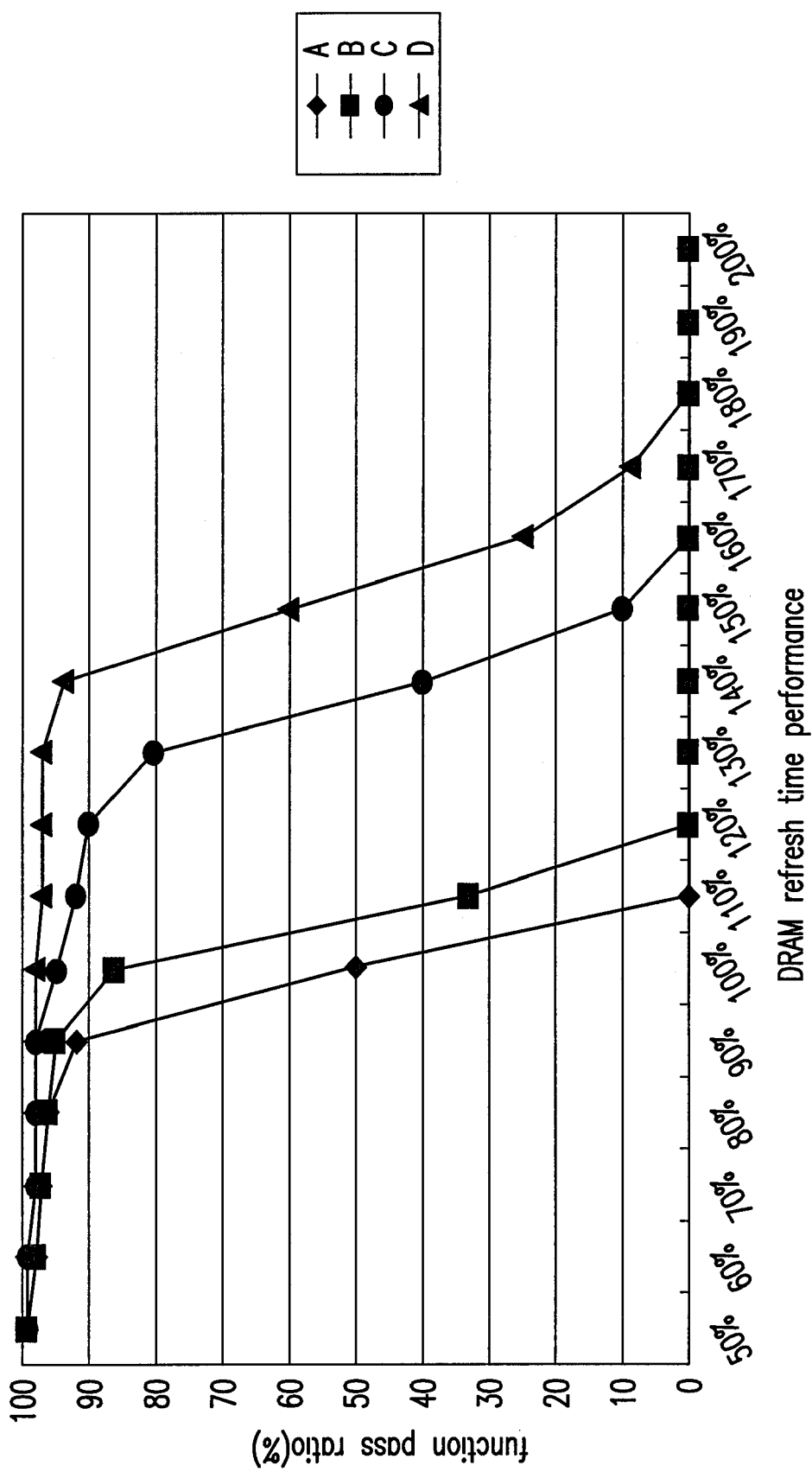
FIG. 2 schematically illustrates a diagram of function pass ratio as a function of DRAM fresh time performance under different annealing conditions according to an example of the present invention.

FIG. 2 schematically illustrates a diagram of function pass ratio as a function of DRAM fresh time performance under different annealing conditions according to an example of the present invention.

Referring to FIG. 2, line A represents the condition in which an annealing process is performed with hydrogen in a concentration of 71% after the step of etching the upmost aluminum layer to form the pad in the aluminum backend process. Line B represents the condition in which an annealing process is performed with hydrogen in a concentration of 9.1% after the step of etching the upmost aluminum layer to form the pad in the copper backend process. Line C represents the condition in which an annealing process is performed with hydrogen in a concentration of 71% before the step of etching the upmost aluminum layer to form the pad in the copper backend process. Line D represents the condition that an annealing process is performed with hydrogen in a concentration of 71% after the step of etching the upmost aluminum layer to form the pad in the copper backend process. It is noted that line A is the standard baseline in terms of the DRAM refresh time performance, and other lines B, C and D are normalized based on line A. In this example, in the aluminum backend process, the interconnection includes aluminum as a conductive line material and tungsten as a plug material, and the dielectric layer includes silicon oxide. In the copper backend process, the interconnection includes copper as a conductive line material and a plug material, the pad includes aluminum and the dielectric layer includes SiN, SiCN, a low-k material with a dielectric constant less than 4, or FSG.

As shown in FIG. 2, wherein lines A, C and D are compared, the DRAM fresh time performance is significantly improved when the annealing process is performed with high concentration of hydrogen in the copper backend process (lines C and D), rather than in the aluminum backend process (line A), and the DRAM fresh time performance of lines C and D is increased by 40-60% compared to that of line A. According to the comparison between lines C and D, the DRAM fresh time performance is further improved when the annealing process is performed with high concentration of hydrogen after the step of etching the upmost aluminum layer to form the pad (line D), rather than before the same step (line C), and the DRAM fresh time performance of line D is increased by 20% compared to that of line C. According to the comparison between lines B and D, the DRAM fresh time performance is much improved when the annealing process is performed with high concentration of hydrogen (line D), rather than with low concentration of hydrogen (line B), after the step of etching the upmost aluminum layer to form the pad. According to the comparison between lines A and D, under the same annealing step with high concentration of hydrogen, the dielectric layer of the copper backend process after one time of aluminum etching (line D) has the better recovering performance than the dielectric layer of the aluminum backend process after a plurality of times of aluminum etching (line A). Based on the above result, the damage caused by the aluminum etching is one of the main reasons of affecting the DRAM fresh time performance.

The testing results show that in the copper backend process, the annealing process can effectively reduce the leakage and extend the refresh time, no matter the annealing process is performed before or after the step of etching the aluminum layer to form the pad with high concentration of hydrogen.

In summary, in the semiconductor process of the present invention, a interconnection structure including copper is formed, and an annealing process is performed before or after the step of etching the metal layer to form the pad with high concentration of hydrogen; thus, the charges or impurities accumulated on the surface of the substrate can be removed by small-molecular hydrogen having an excellent diffusion property, and the dangling bonds are repaired and reduced to stabilized bonds by hydrogen. Therefore, by performing the annealing process with high concentration of hydrogen, the present invention can reduce the possibility of leaking, increase the DRAM refresh time, increase the operation efficiency and save the power consumption.

This invention has been disclosed above in the preferred embodiments, but is not limited to those. It is known to persons skilled in the art that some modifications and innovations may be made without departing from the spirit and scope of this invention. Hence, the scope of this invention should be defined by the following claims.

What is claimed is:

1. A semiconductor process, comprising:
providing a substrate, the substrate having a dielectric layer formed thereon;
forming an interconnection structure in the dielectric layer, the interconnection structure comprising copper;
forming a metal layer on the dielectric layer;
patterning the metal layer to form a pad; and
performing an annealing process, wherein a gas source for the annealing process comprises hydrogen in a concentration of 50% to 90%.

2. The process of claim 1, wherein the step of performing the annealing process is after the step of forming the metal layer and before the step of patterning the metal layer.

3. The process of claim 1, wherein the step of performing the annealing process is after the step of forming the pad.

4. The process of claim 1, wherein a temperature of the annealing process is between 410° C. and 475° C.

5. The process of claim 1, wherein a time of the annealing process is between 20 minutes and 60 minutes.

6. The process of claim 5, wherein the time of the annealing process is 20 minutes.

7. The process of claim 5, wherein the time of the annealing process is 30 minutes.

8. The process of claim 5, wherein the time of the annealing process is 60 minutes.

9. The process of claim 1, wherein the gas source for the annealing process comprises hydrogen in a concentration of about 70%.

10. The process of claim 1, wherein the step of patterning the metal layer comprises using plasma.

11. The process of claim 1, wherein a material of the dielectric layer is selected from the group consisting of SiN, SiCN, a low-k material with a dielectric constant less than 4 and FSG.

12. The process of claim 1, where a method of forming the interconnection structure comprises performing a damascene process.

* * * * *